(12) United States Patent
Sekikawa et al.

(10) Patent No.: US 12,525,517 B2
(45) Date of Patent: Jan. 13, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Hiroaki Sekikawa, Tokyo (JP); Yasutaka Nakashiba, Tokyo (JP); Hideki Sasaki, Tokyo (JP); Hajime Hayashimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 679 days.

(21) Appl. No.: 17/887,094

(22) Filed: Aug. 12, 2022

(65) Prior Publication Data

US 2023/0134000 A1    May 4, 2023

(30) Foreign Application Priority Data

Oct. 28, 2021    (JP) ................................. 2021-176262

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .... *H01L 23/49558* (2013.01); *H01L 21/4825* (2013.01); *H01L 21/565* (2013.01); *H01L 23/3107* (2013.01); *H01L 23/49503* (2013.01); *H01L 23/4952* (2013.01); *H01L 23/49524* (2013.01); *H01L 23/49562* (2013.01)

(58) Field of Classification Search
CPC . H01L 2224/26125; H01L 2224/26155; H01L 2224/73104; H01L 2224/73153; H01L 2224/73204; H01L 23/49558; H01L 23/49541; H01L 23/49524; H01L 23/49838
See application file for complete search history.

(56) References Cited

U.S. PATENT DOCUMENTS 8,114,710 B2   2/2012  Muto et al.
10,204,849 B2   2/2019  Nakamura et al.

FOREIGN PATENT DOCUMENTS

| JP | 2009-200338 A | 9/2009 |
|---|---|---|
| JP | 2018-121035 A | 8/2018 |
| WO | WO-2020110860 A1 * | 6/2020 |

OTHER PUBLICATIONS

Office Action issued on Dec. 24, 2024 for the corresponding Japanese Application No. 2021-176262, w/ English Translation.

* cited by examiner

*Primary Examiner* — Zandra V Smith
*Assistant Examiner* — Genevieve G Bullard Connor
(74) *Attorney, Agent, or Firm* — Rimon P.C.

(57) ABSTRACT

Reliability of a semiconductor device is improved. The semiconductor device includes a clip which is electrically connected to a main-transistor source pad via a first silver paste and is connected to a lead via a second silver paste. The clip has a "first part" with which the first silver paste is in contact, a "second part" with which the second silver paste is in contact, and a "third part" positioned between the "first part" and the "second part". A protruding member is formed on a surface of the main-transistor source pad, and the "first part" is in contact with the protruding member.

14 Claims, 17 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2021-176262 filed on Oct. 28, 2021, including the specification, drawings and abstract is incorporated herein by reference in its entirety.

BACKGROUND

The present invention relates to a semiconductor device and a technique of manufacturing the same, and relates to, for example, a technique effectively applied to a semiconductor device serving as a constituent element of an inverter and a technique of manufacturing the same.

There are disclosed techniques listed below.

[Patent Document 1] Japanese Unexamined Patent Application Publication No. 2018-121035

[Patent Document 2] Japanese Unexamined Patent Application Publication No. 2009-200338

Japanese Unexamined Patent Application Publication No. 2018-121035 (Patent Document 1) describes techniques related to a package structure of a semiconductor device serving as a constituent element of an inverter.

Japanese Unexamined Patent Application Publication No. 2009-200338 (Patent Document 2) describes techniques of electrically connecting a plate-like member with a source pad of a semiconductor chip via a conductive material typified by a solder material or silver paste in a semiconductor device including a lead serving as an external terminal and a semiconductor chip with a power Metal Oxide Semiconductor Field Effect Transistor (MOSFET) formed therein, the lead and the semiconductor chip being mutually and electrically connected by a plate-like member called "Cu clip".

SUMMARY

For example, as a semiconductor device which seals a semiconductor chip with a power transistor formed therein, there is a semiconductor device including a lead and an electrode called pad formed on a surface of the semiconductor chip, the lead and the electrode being connected to each other by a plate-like member called "clip". In this semiconductor device, it is desired to improve the reliability of the connection between the pad and the plate-like member.

A semiconductor device in an embodiment includes a plate-like member which is electrically connected to a first electrode via a first conductive material and is connected to a lead via a second conductive material. This plate-like member has a first part with which the first conductive material in contact, a second part with which the second conductive material is in contact, and a third part positioned between the first part and the second part. A protruding member is formed on a surface of the first electrode, and the first part is in contact with the protruding member.

A semiconductor device in an embodiment includes a plate-like member which is electrically connected to a first electrode via a first conductive material and is connected to a lead via a second conductive material. This plate-like member has a first part with which the first conductive material is in contact, a second part with which the second conductive material is in contact, and a third part positioned between the first part and the second part. A protruding member with which the third part is in contact is formed on a protective film covering a peripheral portion of the first electrode.

A method of manufacturing a semiconductor device in an embodiment includes a step of mutually and electrically connecting a first electrode and a lead via a plate-like member by disposing a first part of the plate-like member on the first electrode via a first conductive material and disposing a second part of the plate-like member on the lead via a second conductive material.

In this step, by causing the first part or the third part of the plate-like member to be in contact with the protruding member, the plate-like member is disposed on the first electrode and on the lead in a state in which the first part has a positive tilt so that a height of the protruding member is larger than a height of a portion between an end part of the plate-like member included in the first part and a surface of the first electrode.

According to an embodiment, reliability of a semiconductor device can be improved.

BRIEF DESCRIPTIONS OF THE DRAWINGS

DETAILED DESCRIPTION

The same components are denoted by the same reference signs in principle throughout all the drawings for explaining the embodiments, and the repetitive description thereof will be omitted. Note that hatching may be used even in a plan view so as to make the drawings easy to see.

<12-Phase Brushless DC Motor Control System>

In a 12-phase brushless DC motor control system which controls a 12-phase brushless DC motor, 4 sets of conventional three phases (U-phase, V-phase, W-phase) are used.

Inverter circuits are used as circuits which control the phases, and an alternating-current power supplied from the inverter circuits is supplied to coils of respective phases of the brushless DC motor. Therefore, in a brushless DC motor control system which controls a 6-phase brushless DC motor or a 12-phase brushless DC motor, 6 or 12 inverter circuits are used.

Figure 1:
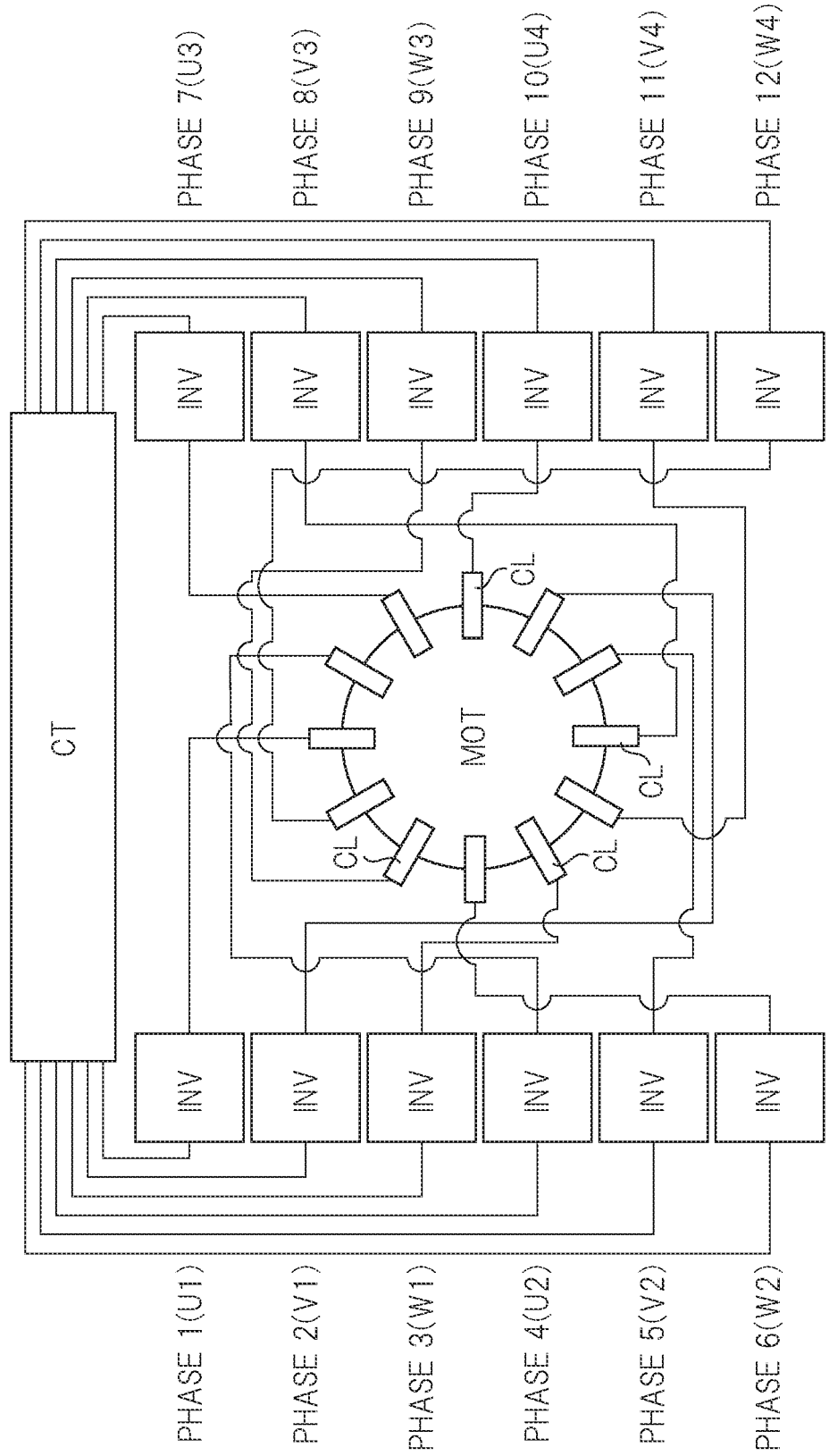
FIG. 1 is a diagram schematically illustrating configuration of a 12-phase brushless DC motor control system.

FIG. 1 is a diagram schematically illustrating a configuration of a 12-phase brushless DC motor control system.

A motor MOT illustrated in FIG. 1 is a 12-phase brushless DC motor, and has 12 coils CL. The coils CL are connected to the inverter circuits INV, respectively. In other words, the inverter circuits INV are provided to respectively correspond to the 12 coils of the motor MOT. Therefore, the 12-phase brushless DC motor control system illustrated in FIG. 1 has 12 inverter circuits INV in total. The inverter circuits INV are connected to a control circuit CT provided in a Micro Controller Unit (MCU), and the inverter circuits are controlled by this control circuit CT. The alternating-current power is supplied from the inverter circuits INV which are controlled by the control circuit CT to the coils CL connected to the respective inverter circuits INV. As a result, the motor MOT is driven.

<Configuration of Inverter Circuit>

Next, a circuit configuration of the inverter circuit INV which is a constituent element of the above-described 12-phase brushless DC motor control system will be explained.

Figure 2:
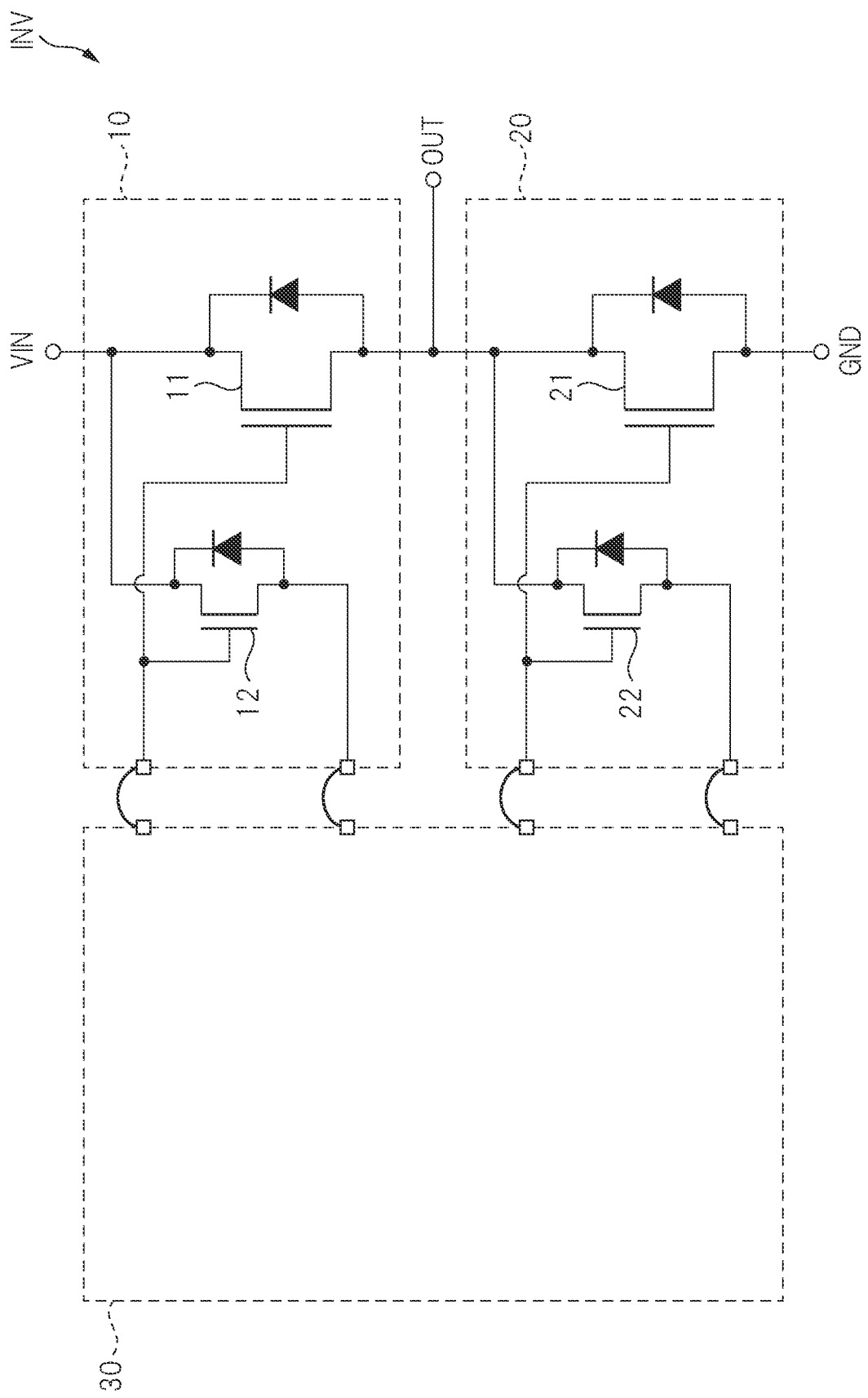
FIG. 2 is a diagram illustrating a circuit configuration of an inverter circuit.

FIG. 2 is a diagram illustrating a circuit configuration of the inverter circuit INV.

In FIG. 2, the inverter circuit INV has a high-side switching circuit 10, a low-side switching circuit 20, and a control circuit 30.

The high-side switching circuit 10 includes a main transistor 11 made of a power transistor, and a sense transistor 12.

On the other hand, the low-side switching circuit 20 includes a main transistor 21 made of a power transistor, and a sense transistor 22.

In the high-side switching circuit 10 and the low-side switching circuit 20 configured as described above, the main transistor 11 included in the high-side switching circuit 10 and the main transistor 21 included in the low-side switching circuit 20 are connected in series between a power-supply potential VIN and a ground potential GND.

In FIG. 2, a connection node between the main transistor 11 and the main transistor 21 is "OUT", and this connection node is connected to the coil CL illustrated in FIG. 1.

Next, the control circuit 30 includes, for example, a pre-driver, which applies a gate voltage to a gate electrode of the main transistor 11 or a gate electrode of the sense transistor 12, and a pre-driver, which applies a gate voltage to a gate electrode of the main transistor 21 or a gate electrode of the sense transistor 22. The inverter circuit INV is configured as described above.

The control circuit 30 is configured to control on/off of the main transistor 11 included in the high-side switching circuit 10 and to control on/off of the main transistor 21 included in the low-side switching circuit 20 based on control signals output from the control circuit CT illustrated in FIG. 1. In other words, the control circuit 30 controls on/off of the main transistor 11 by switching the gate voltage applied to the gate electrode of the main transistor 11 and controls on/off of the main transistor 21 by switching the gate voltage applied to the gate electrode of the main transistor 21.

In this manner, by the on/off control of the main transistor 11 and the on/off control of the main transistor 21, alternating-current power is supplied from the connection node ("OUT") between the main transistor 11 and the main transistor 21 to the coil CL illustrated in FIG. 1.

The inverter circuit INV is configured as described above.

<Package Structure>

Subsequently, a mounting configuration of the inverter circuit INV will be described.

Figure 3:
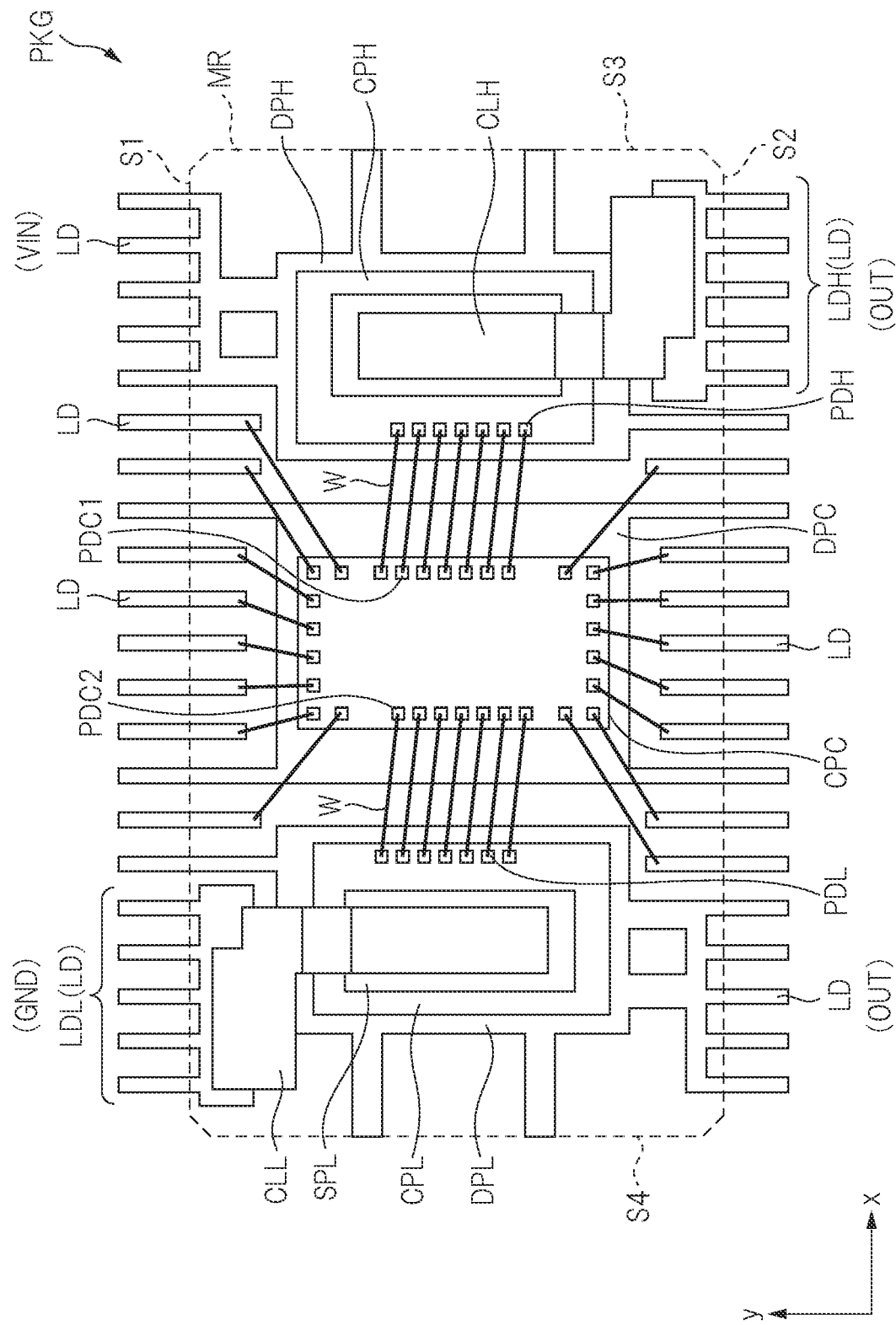
FIG. 3 is a diagram illustrating a mounting configuration of a semiconductor device which achieves the inverter circuit.

FIG. 3 is a diagram illustrating a mounting configuration of a semiconductor device PKG which achieves the inverter circuit.

In FIG. 3, the semiconductor device PKG has a sealing body MR having a rectangular shape as a planar shape thereof. This sealing body MR has a side S1 which is a long side, a side S2 facing the side S1, a side S3 which is a short side intersecting with the side S1 and the side S2, and a side S4 facing the side S3. Leads LD protrude from the side S1 and the side S2 which are the long sides.

In FIG. 3, an outline of the sealing body MR is illustrated by a broken line, and constituent elements sealed in the sealing body MR are illustrated. Hereinafter, an inner configuration of the sealing body MR will be explained.

The semiconductor device PKG has a die pad DPC which is a chip mounting part, a die pad DPL which is a chip mounting part, and a die pad DPH which is a chip mounting part. Specifically, the die pad DPL, the die pad DPC, and the die pad DPH are disposed to be arranged in this order in an x-direction. In other words, the die pad DPL is disposed on the left side, the die pad DPC is disposed at the central part, and the die pad DPH is disposed on the right side.

A semiconductor chip CPC is mounted on the die pad DPC. The control circuit 30 illustrated in FIG. 2 is formed on this semiconductor chip CPC. On a surface of the semiconductor chip CPC, plural pads including plural pads PDC1 and plural pads PDC2 are formed. In this manner, the semiconductor chip CPC mounted on the die pad DPC is disposed at the central part of the semiconductor device PKG.

A semiconductor chip CPL is mounted on the die pad DPL. The low-side switching circuit 20 illustrated in FIG. 2 is formed on the semiconductor chip CPL. More specifically, on the semiconductor chip CPL, the main transistor 21 and the sense transistor 22 constituting the low-side switching circuit 20 are formed. Each of the main transistor 21 and the sense transistor 22 is made of a vertical trench power transistor which flows currents in a thickness direction of the semiconductor chip CPL. Plural pads PDL are formed on a surface of the semiconductor chip CPL together with a main-transistor source pad SPL. The plural pads PDL include a source pad for the sense transistor, a gate pad that is common between the main transistor 21 and the sense transistor 22, etc.

As illustrated in FIG. 3, a clip CLL which is a plate-like member made of copper is disposed on the main-transistor source pad SPL. As illustrated in FIG. 3, the clip CLL is electrically connected to a lead LDL. On the other hand, the plural pads PDL are electrically connected to the respective plural pads PDC2 formed on the surface of the semiconductor chip CPC by bonding wires W.

Subsequently, a semiconductor chip CPH is mounted on the die pad DPH. The high-side switching circuit 10 illustrated in FIG. 2 is formed on this semiconductor chip CPH. In the present embodiment, the semiconductor chip CPL on which the low-side switching circuit 20 is formed and the semiconductor chip CPH on which the high-side switching circuit 10 is formed are the semiconductor chips of the same types as each other. Therefore, explanation for the semiconductor chip CPH is omitted.

In the present embodiment, the planar shape of the semiconductor device PKG is substantially rectangular (specifically, a rectangle with chamfered corner portions) as illustrated in FIG. 3. In the present embodiment, the planar shape of each of the semiconductor chips is also rectangular as illustrated in FIG. 3. In the present embodiment, as illustrated in FIG. 3, the semiconductor chip CPC, the semiconductor chip CPL, and the semiconductor chip CPH are disposed so that short sides of the semiconductor chips are along the long sides of the semiconductor device PKG. In this manner, the sizes of the semiconductor chips and the size of the semiconductor device PKG are reduced.

As described above, the mounting configuration of the semiconductor device PKG made of System in Package (SiP) in which the semiconductor chip CPC, the semiconductor chip CPL, and the semiconductor chip CPH on which the circuits constituting the inverter circuits INV are formed are mounted in one package structure is implemented.

<Study for Improvement>

Hereinafter, the clip CLL is exemplified as the plate-like member, and a room for improvement in the semiconductor device PKG will be described. However, as illustrated in FIG. 3, the semiconductor device PKG has a clip CLH in addition to the clip CLL. This clip CLH also has the similar room for improvement as well as the clip CLL. However, the following descriptions of the specification focus on the clip CLL to describe the room for improvement in the semiconductor device PKG.

In the above-described semiconductor device PKG, from a viewpoint to improve heat dissipation efficiency, a configuration in which back surfaces of the die pads DPL (the die pad DPC, the die pad DPH) are exposed from a lower surface of the sealing body MR is employed in order to improve a heat release efficiency in some cases. The present inventors have newly found out that the semiconductor device PKG having such a configuration has the following room for improvement.

Figure 4:
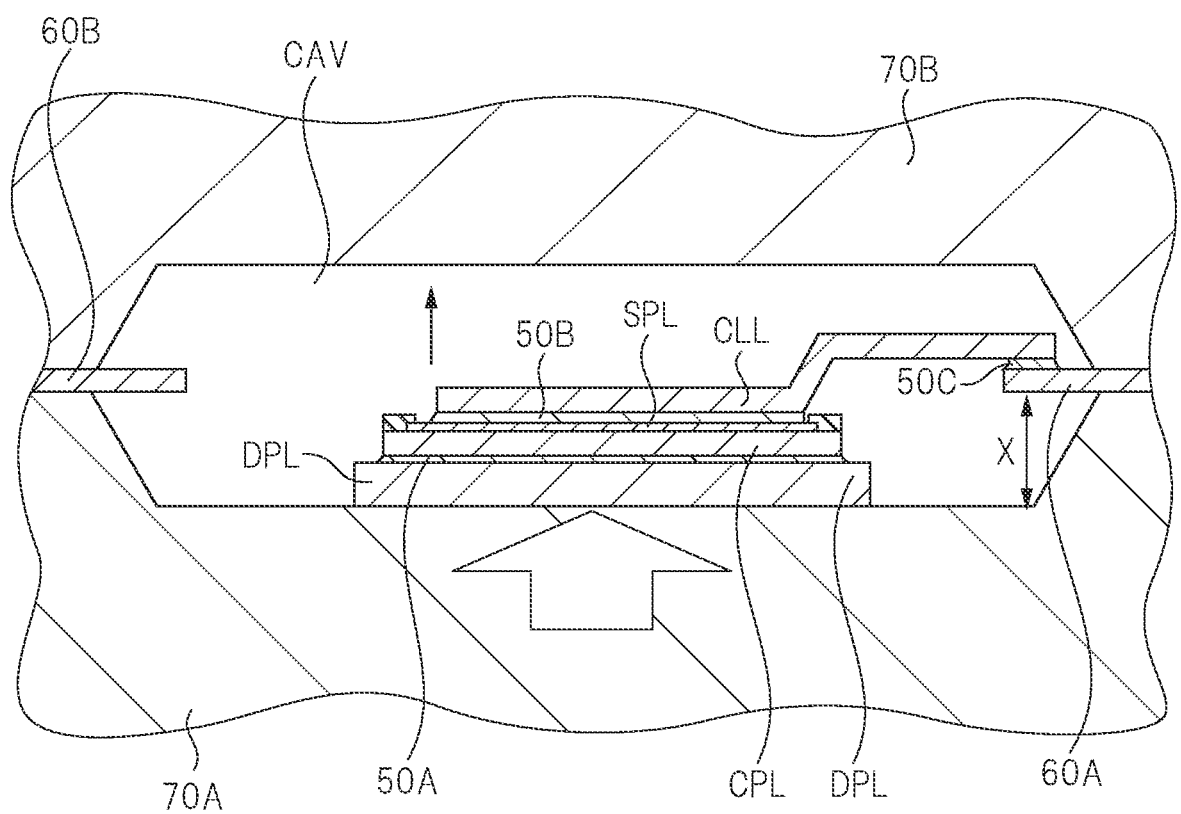
FIG. 4 is a diagram for explaining a room for improvement newly found out by the present inventors and is a cross-sectional view illustrating a mold step of forming a sealing body.

FIG. 4 is a diagram for explaining the room for improvement newly found out by the present inventors, and is a cross-sectional view illustrating a mold step of forming the sealing body MR. In FIG. 4, a lead 60A and a lead 60B present in a lead frame are sandwiched by a lower mold 70A and an upper mold 70B. In a cavity CAV, the die pad DPL, the semiconductor chip CPL mounted on the die pad DPL via silver paste 50A, and the clip CLL mounted on the main-transistor source pad SPL which is formed on the semiconductor chip CPL via silver paste 50B are disposed. This clip CLL is connected to the lead 60A via silver paste 50C. In other words, the clip CLL has a function to electrically connect the main-transistor source pad SPL and the lead 60A.

In the mold step illustrated in FIG. 4, the sealing body is formed by injecting a resin into the cavity CAV. In this step, if a gap is present between the lower mold 70A and the die pad DPL in FIG. 4, the resin flows also into this gap. Therefore, in order to prevent the gap into which the resin flows from being formed between the lower mold 70A and the die pad DPL, the mold step is performed while, for example, a pressing force toward the cavity CAV is applied from the lower mold 70A to the die pad DPL as illustrated in FIG. 4.

In this case, the lead 60A and the lead 60B are sandwiched and fixed by the lower mold 70A and the upper mold 70B. On the other hand, the die pad DPL is pressed toward the cavity CAV by the above-described pressing force. As a result, "offset X" representing a height difference between the lead 60A (60B) and the die pad DPL illustrated in FIG. 4 is changed to be small. Then, a force in a direction illustrated by an arrow in FIG. 4 is applied to the clip CLL which is connecting both of the lead 60A and the semiconductor chip CPL.

Figure 5:
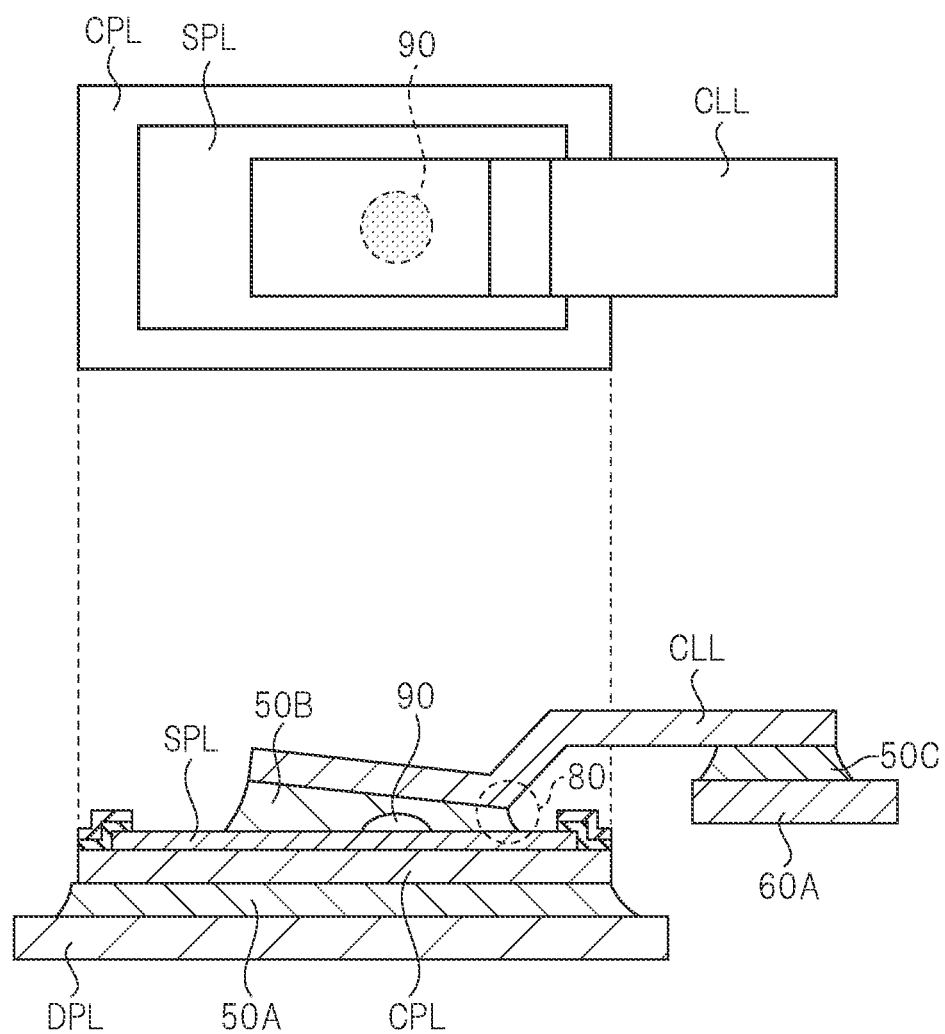
FIG. 5 is a diagram illustrating a state in which a clip has "negative tilt".

As a result, for example, as illustrated in FIG. 5, the clip CLL is deformed. Specifically, the clip CLL connected to both of the lead 60A and the main-transistor source pad SPL formed on the semiconductor chip CPL is generally disposed in parallel to the semiconductor chip CPL. However, deformation causing the end part of the clip CLL as illustrated in FIG. 5 to be higher than a root part of the clip CLL is caused by the above-described pressing force applied to the die pad DPL.

In the present specification, the shape in which the end part of the clip CLL is higher than the root part of the clip CLL as illustrated in FIG. 5 is referred to as "negative tilt".

In this manner, in the mold step of manufacturing the semiconductor device PKG for exposing a back surface of the die pad DPL from the lower surface of the sealing body MR, the pressing force toward the cavity CAV is applied to the die pad DPL from the lower mold 70A in order to prevent the gap into which the resin flows from being formed between the lower mold 70A and the die pad DPL. As a result, for example, as illustrated in FIG. 5, the shape of the clip CLL becomes "negative tilt".

When the shape of the clip CLL is the "negative tilt", a part of the silver paste 50B in contact with the root part 80 of the clip CLL becomes thinner than the other part of the silver paste 50B. As a result, due to a structural stress applied to the semiconductor device, for example, a part 90 of the silver paste 50B illustrated in FIG. 5 is peeled off.

Regarding this point, the silver paste 50B has a function to electrically connect the clip CLL and the main-transistor source pad SPL formed on the semiconductor chip CPL, and serves as a current path through which a current flows. Therefore, when the silver paste 50B which serves as the current path is peeled off, the peel-off region becomes a high impedance region, which results in a high on-resistance of the semiconductor device. Furthermore, in a case of the semiconductor device on which the sense transistor is mounted, this can cause variations in a sense ratio. In other words, the peel-off in the silver paste 50B adversely affects the performance of the semiconductor device. Therefore, it is desired to suppress the "negative tilt" of the clip CLL which causes the peel-off of the silver paste 50B.

<Explanation for Related Art>

There are the following related art for suppressing the "negative tilt" of the clip CLL.

The "related art" described in the present specification is not publicly known techniques, but is the technique which has the problems found out by the present inventors and is the technique which serves as a premise of the present application invention.

Figure 6:
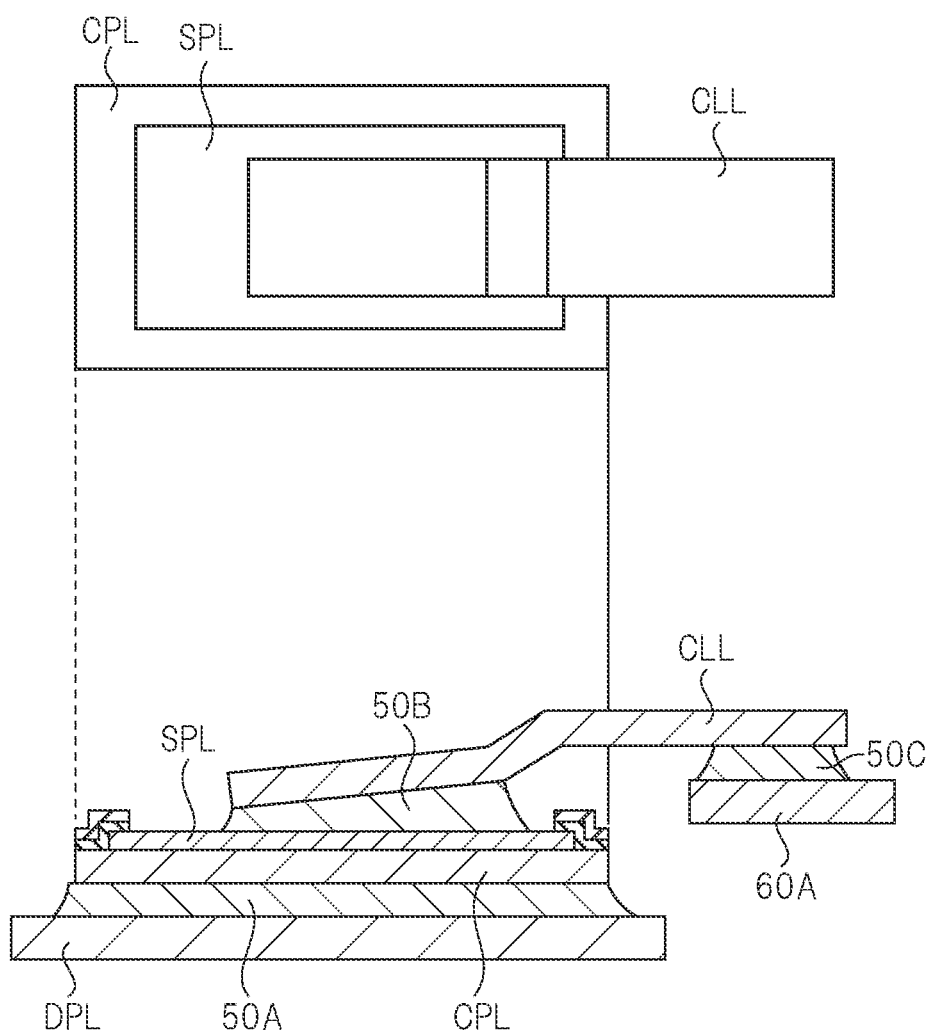
FIG. 6 is a schematic diagram illustrating a related art.

FIG. 6 is a schematic diagram illustrating the related art.

As illustrated in FIG. 6, in the related art, the end part of the clip CLL is previously shaped to be lower than the root part of the clip CLL. Herein, in the present specification, the shape in which the end part of the clip CLL becomes lower than the root part of the clip CLL as illustrated in FIG. 6 is referred to as "positive tilt". In this manner, in the related art, the clip CLL is shaped to be "positive tilt" by previously processing the clip CLL.

As a result, according to the related art, even when the pressing force toward the cavity CAV is applied to the die pad DPL from the lower mold 70A in order to prevent the gap into which the resin flows from being formed between the lower mold 70A and the die pad DPL, the shape of the clip CLL can be suppressed from having the "negative tilt" caused by the pressing force since the shape of the clip CLL has previously the "positive tilt" instead of a flat shape. Therefore, the related art is effective from the viewpoint of suppressing the "negative tilt" of the clip CLL, which is a cause of the peel-off of the silver paste 50B.

Herein, for example, as a method of shaping the clip CLL to have the "positive tilt", deformation processing on the clip CLL is conceivable. However, according to studies of the present inventors, it was found out that the maximum processing accuracy of the clip CLL is ±20 μm and that it is difficult to shape the clip CLL to stably have the "positive tilt". In other words, the concept of the related art of previously shaping the clip CLL to have the "positive tilt" is advantageous from the viewpoint of suppressing the "negative tilt" of the clip CLL which is the cause of the peel-off of the silver paste 50B. However, the related art has a disadvantage from the viewpoint of stable processing of the clip CLL.

As described above, the related art has a room for improvement. Therefore, in the present embodiment, a devisal for solving the room for improvement in the above-described related art is made. Hereinafter, a technical idea in the present embodiment with this devisal will be explained.

<Basic Idea in Embodiment>

A basic idea in the present embodiment is an idea based on a premise that the clip CLL is previously shaped to have the "positive tilt", and is an idea of providing a protruding member in a partial region of the surface of the main-transistor source pad SPL and causing this protruding member to contact the clip CLL having the "positive tilt" in a case in which the clip CLL having the "positive tilt" is connected to the main-transistor source pad SPL by the silver paste 50B. According to this basic idea, the clip CLL having the "positive tilt" can be supported by the protruding member. As a result, the "positive tilt" state of the clip CLL can be stably maintained. Therefore, even if the "positive tilt" varies depending on the processing accuracy of the clip CLL, the stable "positive tilt" can be achieved by a correcting effect of the contact of the protruding member.

Hereinafter, a specific mode embodying this basic idea will be described.

<Specific Mode>

Figure 7:
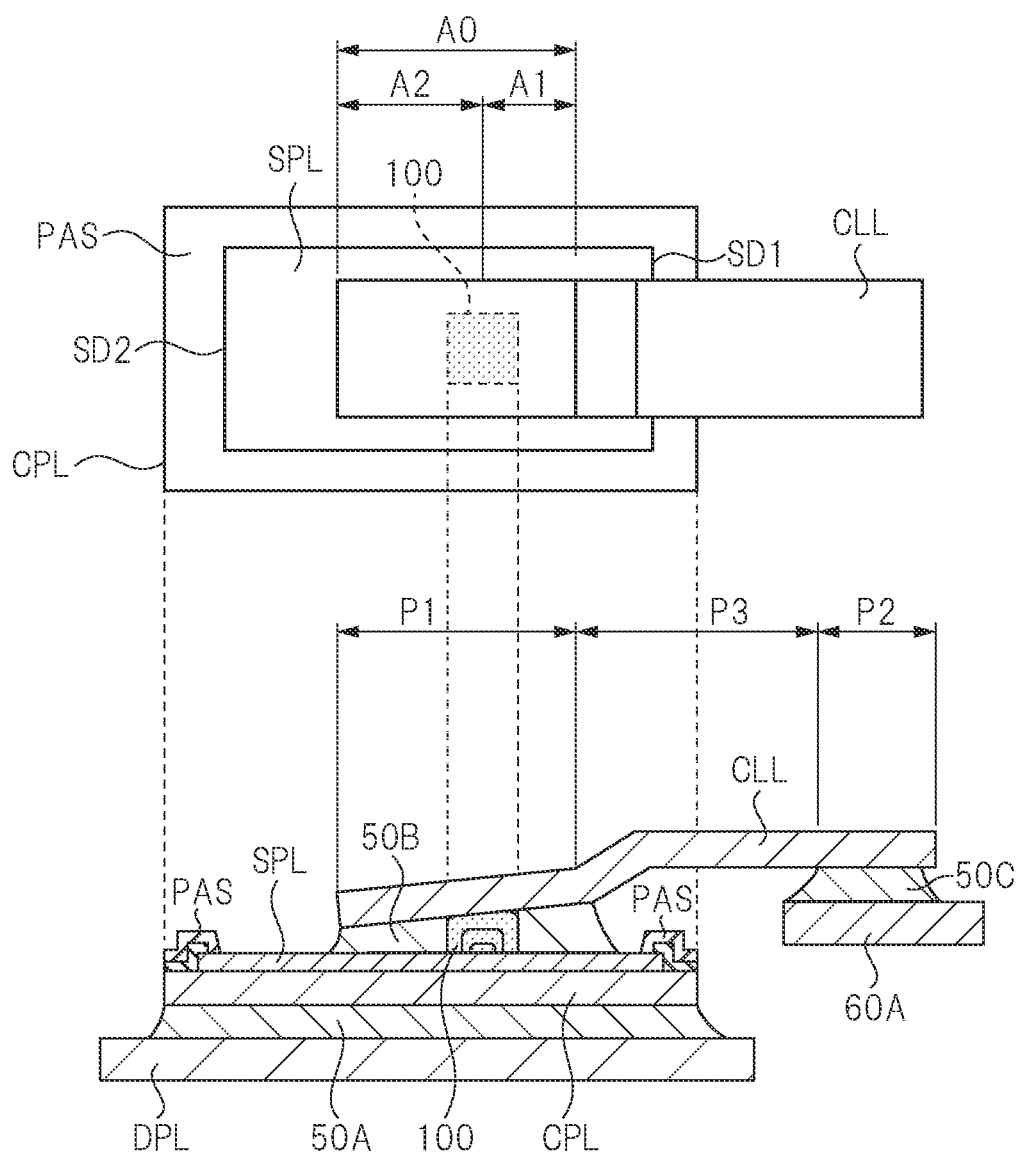
FIG. 7 is a schematic diagram illustrating a specific mode.

FIG. 7 is a schematic diagram illustrating a specific mode. Specifically, an upper diagram in. FIG. 7 is a plan view, and a lower diagram in FIG. 7 is a cross-sectional view.

As illustrated in FIG. 7, the semiconductor chip CPL is mounted on the die pad DPL via the silver paste 50A. The main-transistor source pad SPL (first electrode) is formed on the surface of the semiconductor chip CPL, and a peripheral portion of the main-transistor source pad SPL is covered with a protective film PAS. In other words, the surface of the main-transistor source pad SPL that is not covered with the protective film PAS is exposed.

The lead 60A is disposed next to the semiconductor chip CPL so as to be separated from the die pad DPL. Herein, the term "separate" means "separate" in terms of distance, and means that, for example, the die pad DPL and the lead 60A are separated from each other in terms of distance as illustrated in FIG. 7. The main-transistor source pad SPL and the lead 60A are electrically connected by the clip CLL which is the plate-like member made of copper. Specifically, the clip CLL is electrically connected to the main-transistor source pad SPL via the silver paste 50B and is connected to the lead 60A via the silver paste 50C. This clip CLL is made of a "first part P1" in contact with the silver paste 50B, a "second part P2" in contact with the silver paste 50C, and a "third part P3" positioned between the "first part P1" and the "second part P2".

Herein, the "first part P1" of the clip CLL is tilted such that the distance thereof to the upper surface of the sealing body becomes shorter as it gets closer to the "third part P3" of the clip CLL. In other words, the "first part P1" of the clip CLL has the "positive tilt" in which the end part of the clip CLL is lower than the root part of the clip CLL.

Herein, although not illustrated in FIG. 7, the structure illustrated in FIG. 7 is sealed with the sealing body. For example, the sealing body has an upper surface and a lower surface on the opposite side of the upper surface, and seals the semiconductor chip CPL and the clip CLL so that a part of the back surface of the die pad DPL is exposed from the lower surface while a part of the lead 60A is exposed.

In the structure illustrated in FIG. 7, a protruding member 100 protruding toward the upper surface of the sealing body in comparison with the protective film PAS is formed on the surface of the main-transistor source pad SPL exposed from the protective film PAS. In other words, in the thickness direction of the semiconductor chip CPL, the height from the surface of the main-transistor source pad SPL to the upper surface of the protruding member 100 is higher than the height from the surface of the main-transistor source pad SPL to the upper surface of the protective film PAS. Herein, as illustrated in FIG. 7, the "first part P1" of the clip CLL is in contact with the protruding member 100. The material constituting the protruding member 100 is not particularly limited to but made of, for example, an insulating member.

In FIG. 7, the planar shape of the main-transistor source pad SPL is a tetragon (polygon) provided with the "first side SD1" which intersects with the "third part P3" of the clip CLL and the "second side SD2" on the opposite side of the "first side SD1" in a plan view, and the protruding member 100 is disposed at a position closer to the "first side SD1" than the "second side SD2" in the plan view.

<Dimensional Relations>

Subsequently, an example of dimensional relations will be explained.

Figure 8:
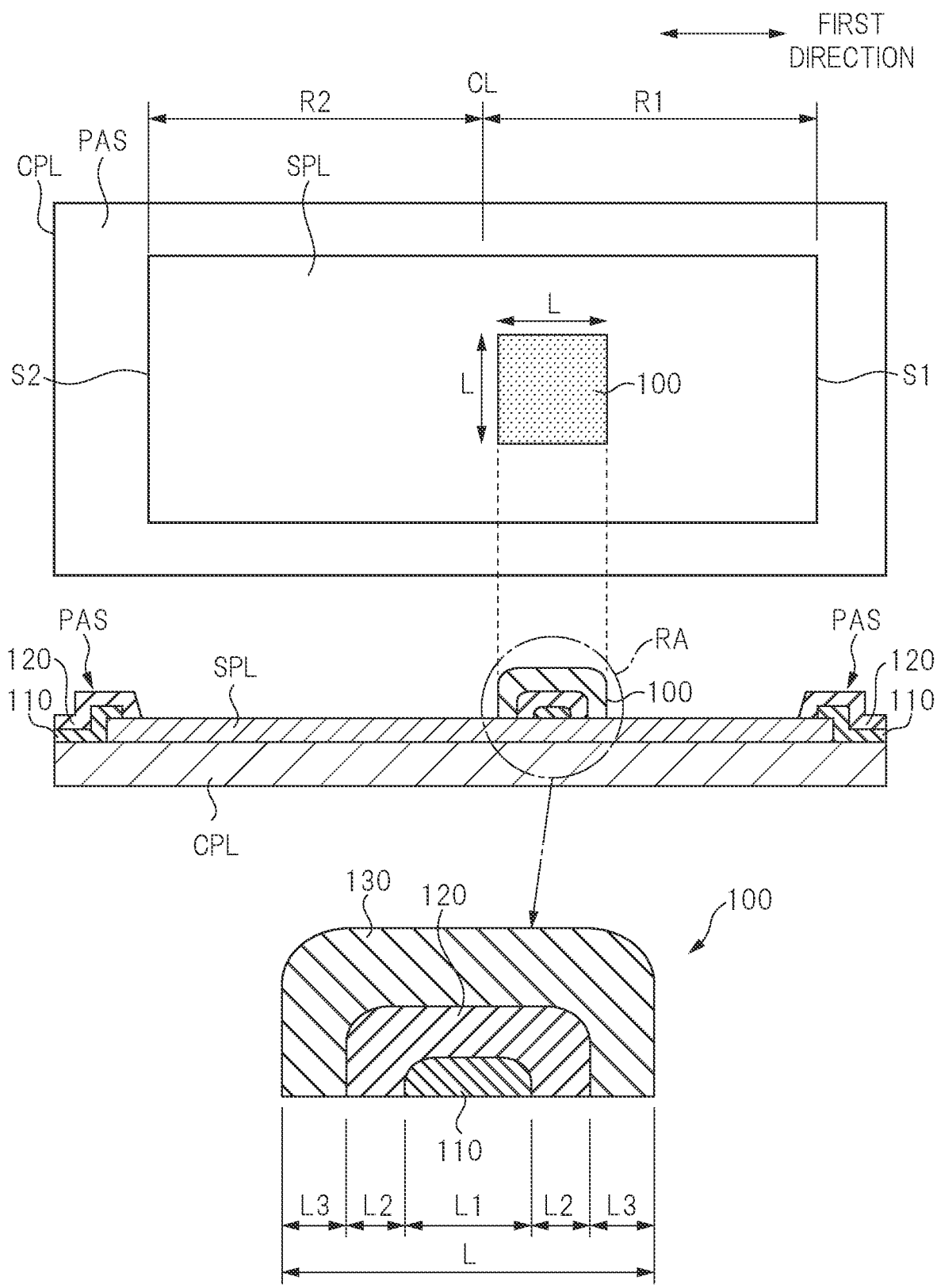
FIG. 8 is a diagram for explaining an example of dimensional relations.

FIG. 8 is a diagram for explaining the example of the dimensional relations.

As illustrated in FIG. 8, regarding the surface of the main-transistor source pad SPL, in a first direction extending from one of the "first side SD1" and the "second side SD2" toward the other one, the main-transistor source pad SPL has a "first region R1" closer to the "first side SD1" than a center line CL and a "second region R2" closer to the "second side SD2" than the center line CL. Herein, as illustrated in FIG. 8, the protruding member 100 is provided in the "first region R1" and is separated from a boundary between the "first region R1" and the "second region R2", which is the center line CL.

Next, in FIG. 8, the planar shape of the protruding member 100 has a square shape. As illustrated in an enlarged view of the protruding member 100 surrounded by a region RA, the protruding member 100 is made of, for example, a silicon oxynitride film 110 (thickness: about 0.9 µm), a first polyimide film 120 (thickness: about 8 µm) formed on the silicon oxynitride film 110, and a second polyimide film 130 (thickness: about 8 µm) formed on the first polyimide film 120. Note that the silicon oxynitride film 110 may be a silicon nitride film (SiN), a silicon carbon nitride film (SiCN), or the like or further may be a stacked film of plural types including a silicon oxide film.

Herein, the dimensions illustrated in FIG. 7 and FIG. 8 are as described below.

(1) "A0"=3 mm
(2) "A1"=1 mm
(3) "A2"=2 mm
(4) "L"=70 µm
(5) "L1"=20 µm
(6) "L2"=10 µm
(7) "L3"=15 µm

Figure 9:
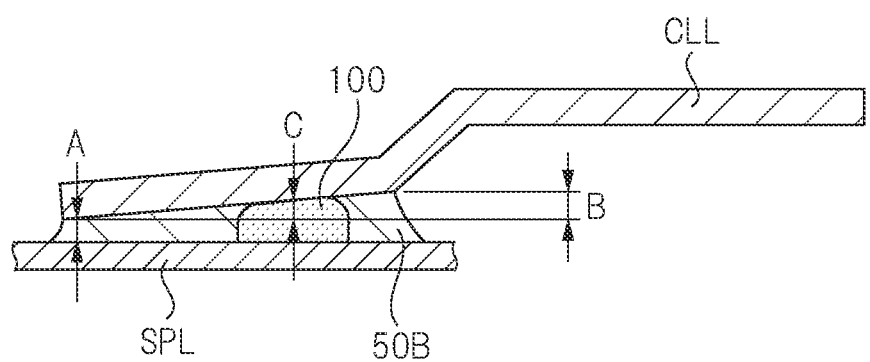
FIG. 9 is a diagram for explaining an example of dimensional relations.
Figure 10:
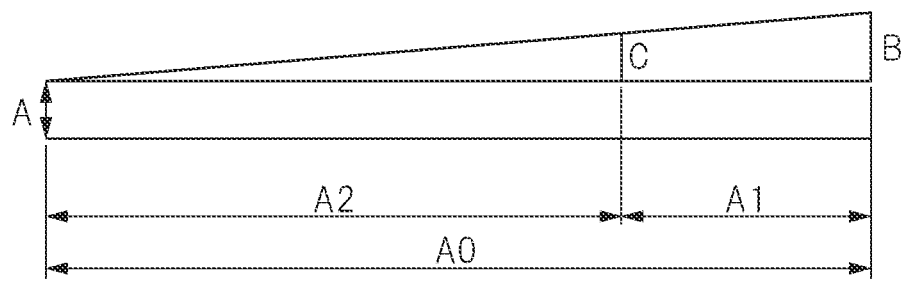
FIG. 10 is a diagram for explaining an example of dimensional relations.

The thicknesses of the following films are considered as described below.

the silicon oxynitride film 110: 0.9 µm
the first polyimide film 120: 8 µm
the second polyimide film 130: 8 µm The dimensions illustrated in FIG. 9 and FIG. 10 are as described below.

(8) "A"=about 10 µm
(9) "B"=10.35 µm
(10) "C"=6.9 µm

<<Feature Points of Structure of Specific Mode>>

Next, feature points of the specific mode will be described.

The feature points of the present embodiment are the embodying of the basic idea by, for example, the protruding member 100 having the layout arrangement and dimensions illustrated in FIG. 7 to FIG. 10, the basic idea providing the protruding member in a partial region of the surface of the main-transistor source pad SPL and causing this protruding member to be contact with the clip CLL having the "positive tilt". In this manner, since the clip CLL having the "positive tilt" can be supported by the protruding member 100, the "positive tilt" state of the clip CLL can be stably maintained. Therefore, even if the "positive tilt" varies depending on the processing accuracy of the clip CLL, the variation of the "positive tilt" is corrected by the correcting effect caused by the contact of the protruding member 100, and thus, the stable "positive tilt" can be achieved. In this manner, the present embodiment can suppress the shape of the clip CLL from having the "negative tilt" because of the pressing force, and can prevent the peel-off of the silver paste 50B. In other words, the present embodiment provides an excellent effect capable of improving the reliability of the semiconductor device because of preventing the peel-off of the silver paste 50B.

Also, for example, as illustrated in FIG. 8, the present embodiment also has a feature point in which the protruding member 100 is made of the stacked film including the first polyimide film 120 and the second polyimide film 130. This is because, even when a stress caused by the pressing force applied to the die pad DPL is generated in the mold step, the protruding member 100 can function as a buffer against the stress since the protruding member 100 in contact with the clip CLL is configured to include the polyimide films having cushioning properties.

As described above, the protruding member 100 has the function of achieving the stable "positive tilt" of the clip CLL and the function as the buffer to absorb the stress. The present embodiment has a significant technical meaning in a point of view of the effective suppression of the peel-off of the silver paste 50B caused by the stress generated in the mold step by the synergetic effects of these functions.

Furthermore, in the present embodiment, the protruding member 100 is disposed at, for example, a position of "A2:A1=2:1" as illustrated in FIG. 7. According to new findings of the present inventors, is found out that the position of "A2:A1=2:1" is a position where the peel-off of the silver paste 50B most likely occurs. Therefore, in the present embodiment, in consideration of the above-described new findings, the protruding member 100 is provided at the position where the peel-off of the silver paste 50B likely occurs. In this manner, the present embodiment can reduce the potential of the occurrence of the peel-off of the silver paste 50B since the silver paste 50B is not present at the position where the peel-off most likely occurs, and thus, can improve the reliability of the semiconductor device.

<<Method of Manufacturing Semiconductor Device>>

Subsequently, a method of manufacturing the semiconductor device in the present embodiment will be explained.

<<Steps of Manufacturing Semiconductor Chip>>

Figure 11:
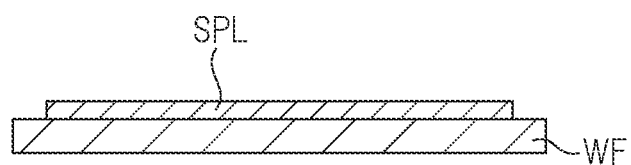
FIG. 11 is cross-sectional view illustrating a step of manufacturing a semiconductor chip.

First, a semiconductor wafer WF having plural chip regions is prepared. Then, by using normal semiconductor manufacturing techniques, the power transistors including the main transistor and the sense transistor are formed in the chip regions, and, then, the main-transistor source pad SPL is formed on the surface of each chip region of the semiconductor wafer WF as illustrated in FIG. 11. This main-transistor source pad SPL is made of, for example, aluminum.

Note that the following FIGS. 11 to 14 illustrate one chip region among the plural chip regions included in the semiconductor wafer WF.

Figure 12:
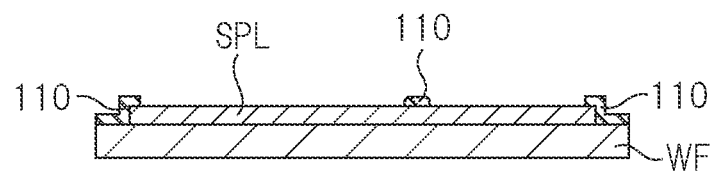
FIG. 12 is cross-sectional view illustrating a step of manufacturing the semiconductor chip, continued from FIG. 11.

Next, as illustrated in FIG. 12, the silicon oxynitride film 110 which covers the main-transistor source pad SPL is formed by, for example, using Chemical Vapor Deposition (CVD). Then, the silicon oxynitride film 110 is patterned by using a photolithography technique and an etching technique. In the patterning of the silicon oxynitride film 110, as illustrated in FIG. 12, the peripheral portion of the main-transistor source pad SPL is covered, and the silicon oxynitride film 110 remains in a protruding-member formation region of the main-transistor source pad SPL. In this patterning, other regions of the main-transistor source pad SPL are exposed.

Figure 13:
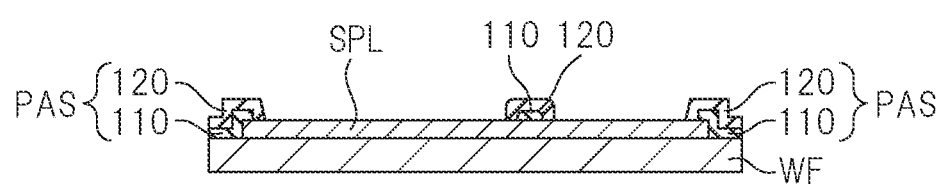
FIG. 13 is a cross-sectional view illustrating a step of manufacturing the semiconductor chip, continued from FIG. 12.

Subsequently, the first polyimide film 120 is patterned by a photolithography technique after the first polyimide film 120 is applied to one entire surface of the semiconductor wafer WF. In the patterning of the first polyimide film 120, for example, as illustrated in FIG. 13, the first polyimide film 120 remains on the silicon oxynitride film 110 formed on the peripheral portion of the main-transistor source pad SPL, and the silicon oxynitride film 110 formed in the protruding-member formation region is covered. As a result, at the peripheral portion of the main-transistor source pad SPL, the protective film PAS made of the stacked film of the silicon oxynitride film 110 and the first polyimide film 120 is formed. Then, for example, the patterned first polyimide film 120 is subjected to a curing process.

Figure 14:
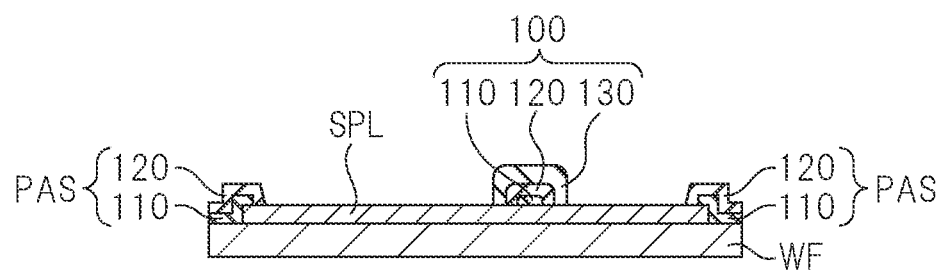
FIG. 14 is a cross-sectional view illustrating a step of manufacturing the semiconductor chip, continued from FIG. 13.

Then, the second polyimide film 130 is patterned as illustrated in FIG. 14 by a photolithography technique after the second polyimide film 130 is applied to the one entire surface of the semiconductor wafer WF. In the patterning of the second polyimide film 130, for example, as illustrated in FIG. 14, the first polyimide film 120 formed in the protruding-member formation region of the main-transistor source pad SPL is covered, and the second polyimide film 130 in the other regions is removed. As a result, in the protruding-member formation region of the main-transistor source pad SPL, the protruding member 100 made of the stacked film of the silicon oxynitride film 110, the first polyimide film 120 and the second polyimide film 130 is formed. Then, for example, the patterned second polyimide film 130 is subjected to the curing process.

Note that, in the patterning of the second polyimide film 130 in the present embodiment, as illustrated in FIG. 14, the first polyimide film 120 formed in the protruding-member formation region of the main-transistor source pad SPL is covered, and the second polyimide film 130 in the other regions is removed. However, the patterning of the second polyimide film 130 is not limited thereto, but may be carried out so that, for example, the second polyimide film 130 remains also on the first polyimide film 120 formed at the peripheral portion. In such a case, the protective film PAS is also made of the stacked film of the silicon oxynitride film 110, the first polyimide film 120 and the second polyimide film 130.

Then, a plating film such as a nickel film, a palladium film or a gold film is formed on the exposed surface of the main-transistor source pad SPL by using non-electrolytic plating method or the like if needed. Then, after the semiconductor wafer WF is subjected to a back-surface grinding step, the semiconductor wafer WF is subjected to dicing. As a result, the plural chip regions of the semiconductor wafer WF are cut and divided into plural semiconductor chips. In this manner, the semiconductor chip of the present embodiment can be manufactured.

<<<Step of Assembling Semiconductor Device>>>

Next, a step of assembling the semiconductor device will be explained.

Figure 15:
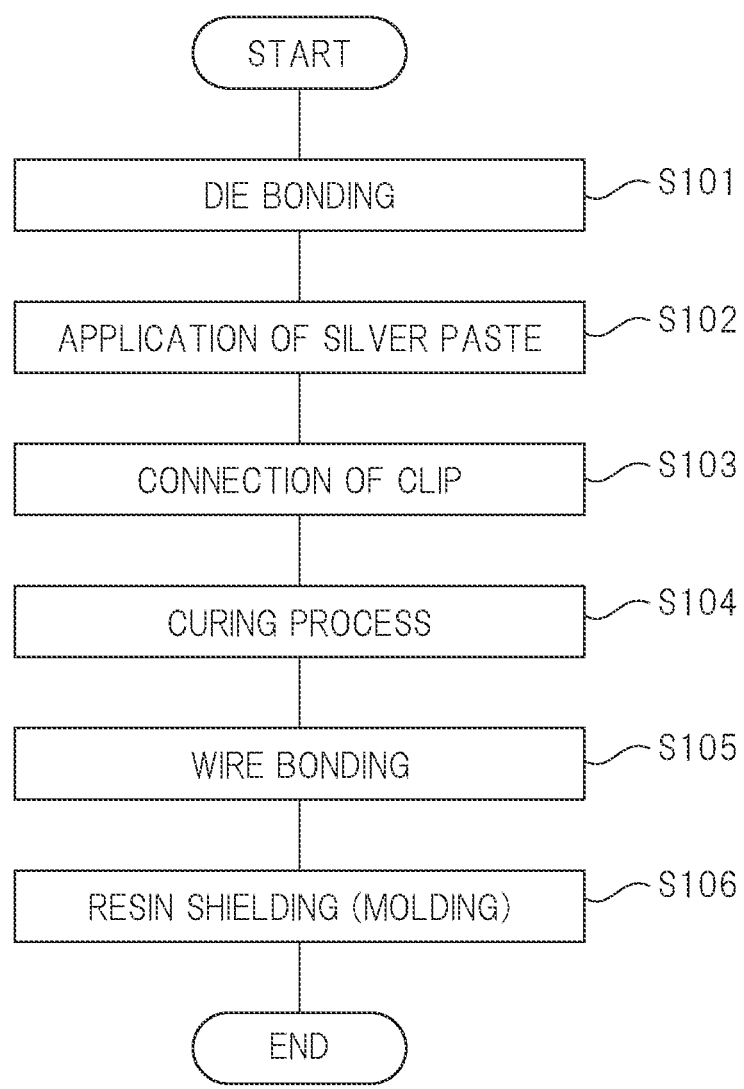
FIG. 15 is a flowchart for explaining a step of assembling the semiconductor device.

FIG. 15 is a flowchart for explaining the step of assembling the semiconductor device.

First, a die pad and a lead frame having a lead separated from the die pad are prepared. Then, the semiconductor chip manufactured by the above-described step of manufacturing the semiconductor chip is mounted on the die pad. Specifically, after the silver paste is applied onto the die pad, the semiconductor chip is mounted on the die pad via this silver paste (S101).

Next, silver paste is applied onto the lead and the main-transistor source pad formed on the surface of the semiconductor chip (S102). Then, a clip is disposed so as to connect the main-transistor source pad and the lead. In this step, the clip is connected to the main-transistor source pad via the silver paste and is connected to the lead via the silver paste. As a result, the main-transistor source pad and the lead are electrically connected to each other by the clip (S103). Then, the curing process (thermal process of about 150° C. to 300° C.) for hardening the silver paste is carried out (S104).

Subsequently, for example, the lead and other pad formed on the surface of the semiconductor chip are connected to each other by a gold wire or a conductive wire. In other words, the lead and the other pad formed on the surface of the semiconductor chip are subjected to wire bonding using the gold wire or the copper wire (S105).

Then, a sealing body is formed by resin sealing (molding) (S106). Then, a plating layer is formed on an outer lead portion of the lead exposed from the sealing body if needed. Then, outside the sealing body, the lead is cut at a predetermined position to separate the sealing body from the frame of the lead frame. Subsequently, the outer lead portion of the lead protruding from the sealing body is processed to be bent. In the above-described manner, the semiconductor device can be manufactured.

<<Feature of Manufacturing Method>>

Figure 16:
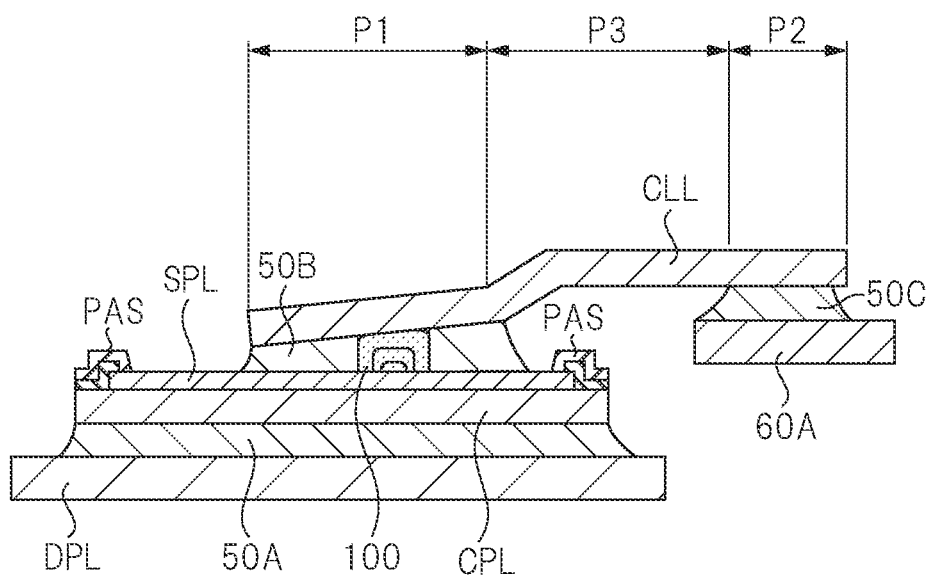
FIG. 16 is a diagram for explaining a step of connecting a clip of FIG. 15.

In the present embodiment, the structure illustrated in FIG. 16 is achieved by the step S103 of FIG. 15. In other words, in FIG. 16, this CLL is made of the "first part P1" in contact with the silver paste 50B, the "second part P2" in contact with the silver paste 50C, and the "third part P3" which is positioned between the "first part P1" and the "second part P2". In the step S103 of FIG. 15, the clip CLL is disposed on the main-transistor source pad SPL and on the lead 60A in the state in which the "first part P1" is caused to have the positive tilt having the height of the protruding member 100 to be higher than the height of the part between the end part of the clip CLL included in the "first part P1" and the surface of the main-transistor source pad SPL by causing the "first part P1" to be in contact with the protruding member 100. In this manner, the clip CLL having the "positive tilt" can be supported by the protruding member 100. As a result, the "positive tilt" state of the clip CLL can be stably maintained. Therefore, even if the "positive tilt" varies depending on the processing accuracy of the clip CLL, the stable "positive tilt" can be achieved since the variation of the "positive tilt" is corrected by the correcting effect caused by the contact of the protruding member 100.

Herein, a feature point of the manufacturing method of the present embodiment is, for example, the formation of the protruding member 100 by using the step of forming the protective film PAS as illustrated in FIG. 11 to FIG. 14. This case only needs to add the step of forming the second polyimide film 130 and the step of patterning the second polyimide film 130, and can reduce a burden of newly adding the step of forming the protruding member 100, and therefore, provides an advantage that is easy formation of the protruding member 100. Particularly, in the case of this manufacturing method, the height of the protruding member 100 can be easily adjusted by adjusting the film thickness of the second polyimide film 130.

Figure 17:
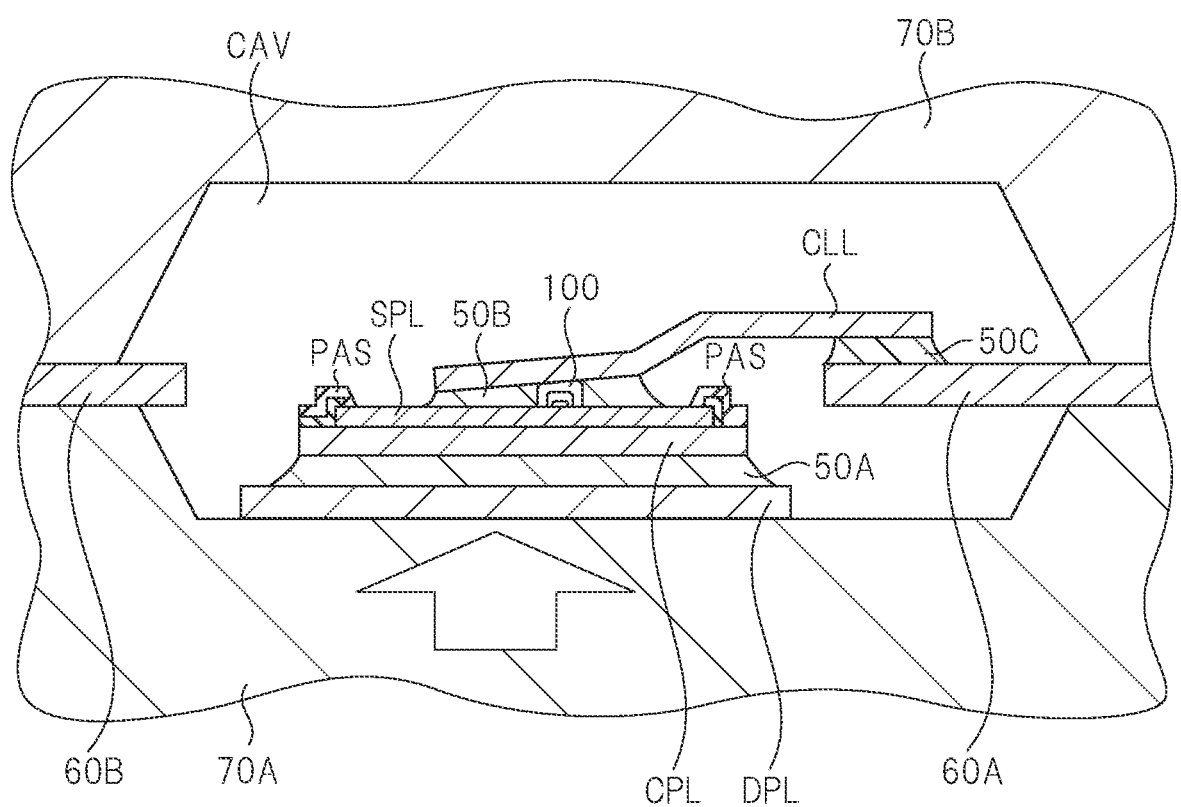
FIG. 17 is a diagram for explaining a resin sealing step of FIG. 15.
Figure 18A:
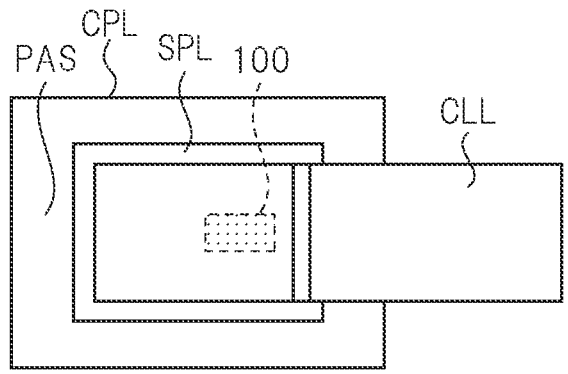
FIG. 18A is a diagram illustrating a planar variation of a protruding member.
Figure 18E:
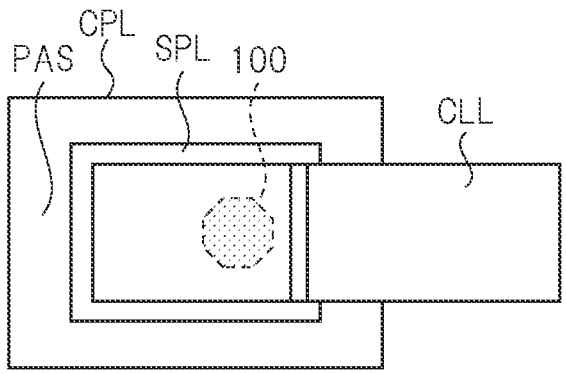
FIG. 18E is a diagram illustrating a planar variation of a protruding member.
Figure 18B:
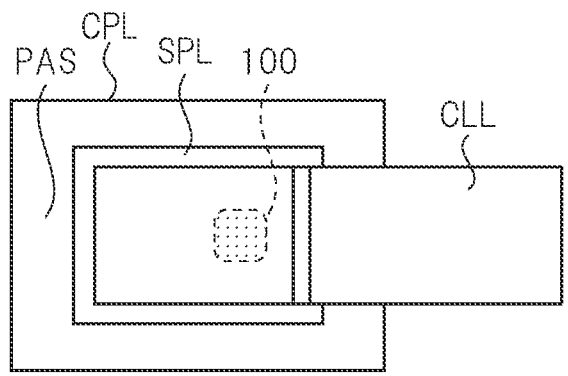
FIG. 18B is a diagram illustrating a planar variation of a protruding member.
Figure 18F:
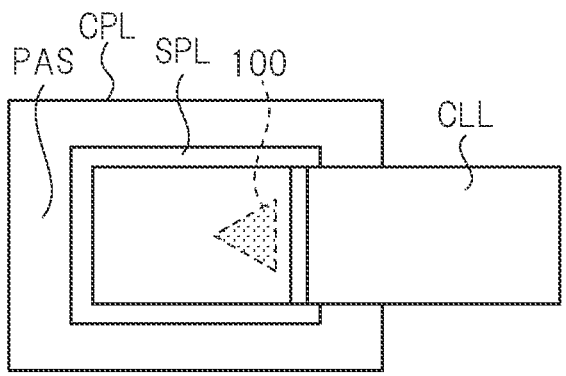
FIG. 18F is a diagram illustrating a planar variation of a protruding member.
Figure 18C:
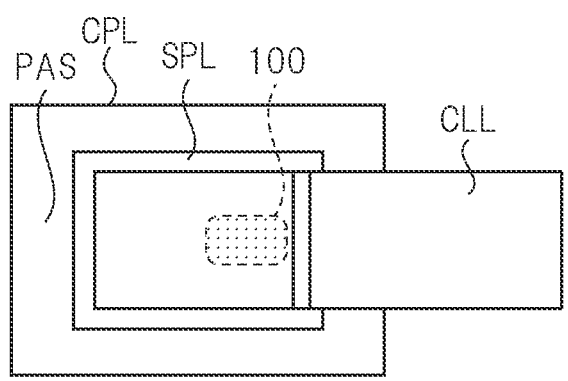
FIG. 18C is a diagram illustrating a planar variation of a protruding member.
Figure 18G:
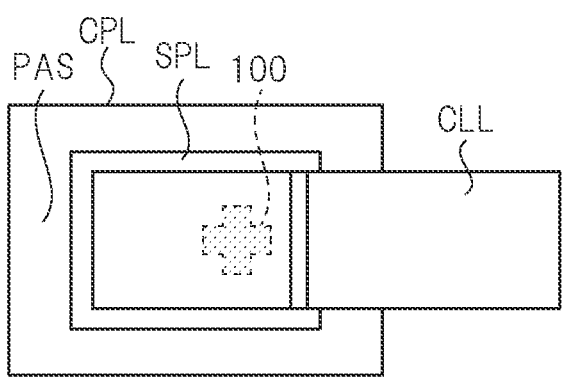
FIG. 18G is a diagram illustrating a planar variation of a protruding member.
Figure 18D:
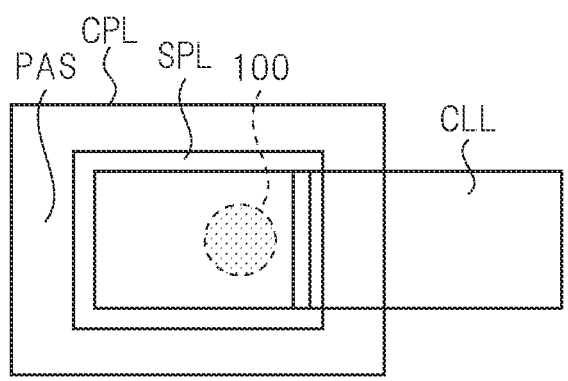
FIG. 18D is a diagram illustrating a planar variation of a protruding member.

Next, the present embodiment, the step S106 of FIG. 15 is carried out by, for example, a manner as illustrated in FIG. 17. FIG. 17 is a schematic diagram illustrating a resin sealing step (mold step) in the present embodiment. As illustrated in FIG. 17, the resin sealing step (S106) in the present embodiment includes a step of sandwiching the lead frame resulted after the clip connecting step (S103) by the lower mold 70A and the upper mold 70B so as to form the cavity space CAV and a step of forming the sealing body by flowing a resin into the cavity space CAV. In this step, the step of sandwiching the lead frame by the lower mold 70A and the upper mold 70B is carried out while the force that presses the die pad DPL into the cavity space CAV is applied by the lower mold 70A.

In the resin sealing step configured as described above, entrance of the resin toward the part between the lower mold 70A and the die pad DPL is suppressed because of the application of the above-described pressing force.

However, when the pressing force toward the cavity CAV is applied from the lower mold 70A to the die pad DPL so as to prevent the gap into which the resin flows from being formed between the lower mold 70A and the die pad DPL, the clip CLL is shaped to have the "negative tilt" as illustrated in FIG. 5 if no measure is taken, and, as a result, the risk of the occurrence of the peel-off arises in the silver paste 50B.

Regarding this point, in the clip connecting step (S103) in the present embodiment, the clip CLL already having the "positive tilt" is used, and the "positive tilt" of the clip CLL is stably maintained by the protruding member 100. As a result, the present embodiment suppresses the "negative tilt" of the clip CLL even if the force that presses the die pad DPL into the cavity space CAV applied in the resin sealing step.

Therefore, the present embodiment can suppress the "negative tilt" of the clip and therefore, can suppress the peel-off of the silver paste 50B caused by the "negative tilt" of the clip CLL. Therefore, the present embodiment can improve the reliability of the semiconductor device.

First Modification Example

FIG. 18A to FIG. 18G are diagrams illustrating variations of planar shapes of the protruding member 100.

In the above-described embodiment, the example in which the planar shape of the protruding member 100 is "square" has been explained (see FIG. 7). However, the planar shape of the protruding member 100 is not limited thereto, but may be formed to have a shape such as "rectangle", "circle", "triangle", or "polygon" as illustrated in FIG. 18A to FIG. 18G.

Second Modification Example

In the above-described embodiment, the example in which the protruding member 100 is made of the stacked film of the silicon oxynitride film 110, the first polyimide film 120 and the second polyimide film 130 has been explained. However, the protruding member 100 is not limited thereto, but may be made of so-called "permanent resist".

The "permanent resist" is a resist used for not removing but leaving it after process (developing process), and is used for, for example, preparation of mechanical electrical machine systems (MEMS) or others. A general resist is removed (by ashing) after being patterned by an exposure development process of the photolithography technique and then being used for an etching process on a process target film. On the other hand, the "permanent resist" is a resist used for leaving it without the ashing.

As an advantage of forming the protruding member 100 to be made of the "permanent resist" as described above, the easy formation of the protruding member 100 having an optional height that is equal to or larger than 10 μm can be exemplified. This is because the "permanent resist" can achieve an optional film thickness within a range of several μm to hundred μm by adjusting a viscosity and a coating rotation speed of the resist.

In a manufacturing method of forming the protruding member 100 to be made of the "permanent resist", for example, the protective film PAS covering the peripheral portion of the main-transistor source pad SPL is formed, and then, the "permanent resist" thicker than the protective film PAS is applied. Then, the formation is achieved by patterning the "permanent resist" through the photolithography technique so that the "permanent resist" is left only in the protruding-member formation region of the exposed surface of the main-transistor source pad SPL.

Note that the protruding member 100 can be made of, for example, a stacked film of the "permanent resist" and the polyimide film having the excellent cushioning properties.

Third Modification Example

Figure 19:
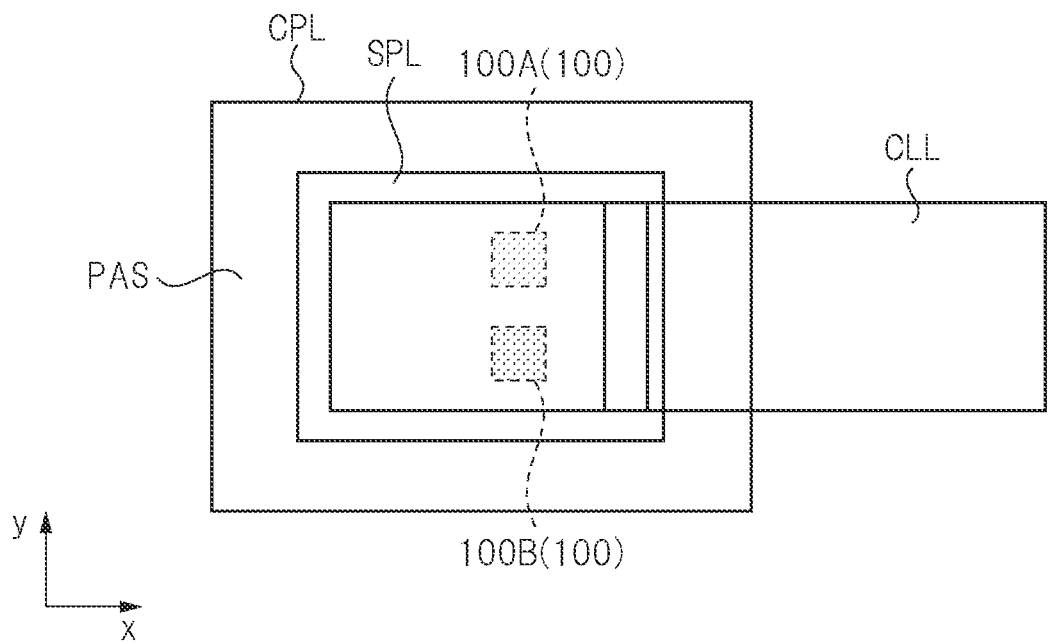
FIG. 19 is a diagram illustrating a configuration example of the protruding member in a third modification example.

FIG. 19 is a diagram illustrating a configuration example of the protruding member in a third modification example.

As illustrated in FIG. 19, the present third modification example, an example of plural protruding members is exemplified. Specifically, in FIG. 19, a protruding member 100A and a protruding member 100B arranged in a y-directions are provided. This case can improve the stability of the arrangement of the clip CLL.

Figure 20:
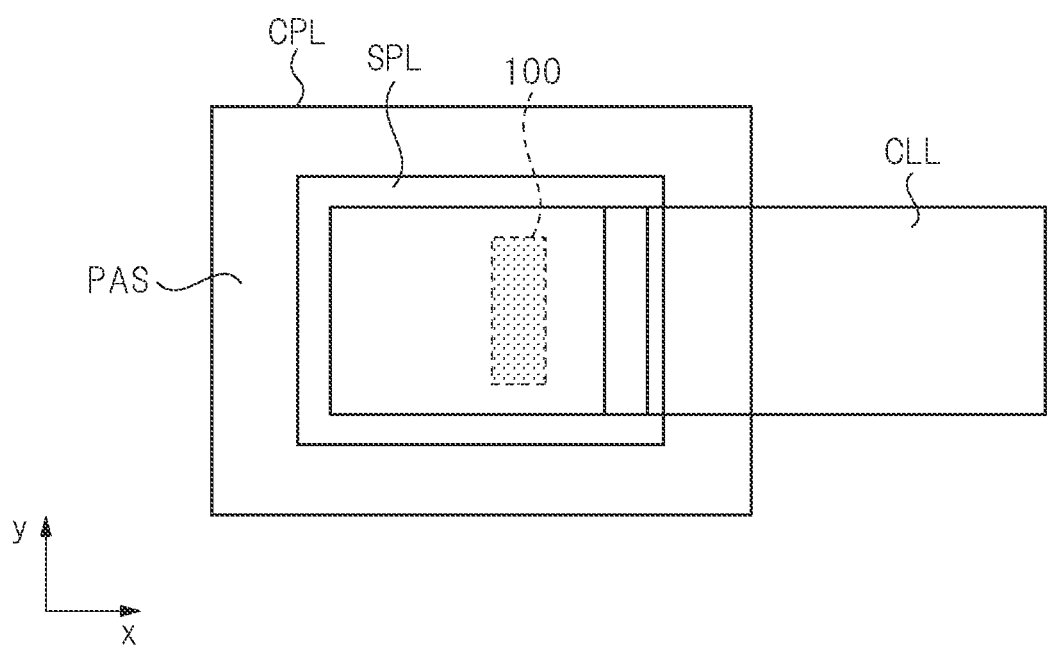
FIG. 20 is a diagram illustrating another configuration example of the protruding member in the third modification example.

FIG. 20 is a diagram illustrating another configuration example of the protruding member in the third modification example.

As illustrated in FIG. 20, in another configuration example, an example in which the planar shape of the protruding member 100 is a rectangle having a short side in an x-direction and a long side in the y-direction is exemplified. This case can improve the stability of the arrangement of the clip CLL.

Fourth Modification Example

In the basic idea of the above-described embodiment, the constituent material of the protruding member may be an electrically conductive material or an insulating material and is not particularly limited. However, in the specific mode embodying the basic idea, the constituent material of the protruding member 100 is the insulating material. Regarding this point, if the protruding member 100 is made of the electrically conductive material, it is taken into consideration that it is difficult to form the protruding member 100 into a desired shape (dimension) and that it is difficult to form the protruding member 100 by suitably utilizing conventional manufacturing steps. On the other hand, if the protruding member 100 is made of the insulating material, the protruding member 100 can be easily formed by, for example, utilizing the step of forming the protective film PAS as illustrated in FIG. 11 to FIG. 14. Therefore, although both the conductive material and the insulating member can be employed as the material of the protruding member 100, it is desirable to from the protruding member 100 from the insulating material in consideration of realistic manufacturing easiness.

However, if the protruding member 100 is made of the insulating material, the protruding member 100 made of the insulating material is provided on the silver paste 50B which serves as the current path. This means that the current path is narrowed, and therefore, causes a risk of performance reduction of the semiconductor device typified by increase in the on resistance. Particularly, if the protruding member 100 is disposed at the position of "A1:A2=1:2" as illustrated in FIG. 7, the effect of preventing the peel-off is considered to be high since the protruding member 100 is disposed at the position where the peel-off likely occurs. On the other hand, the protruding member 100 serves as a large obstructive factor of the current path. Therefore, in present fourth modification example, a devisal for the disposition of the protruding member 100 has been made while particularly focusing on an approach for reducing the obstruction of the current path as small as possible.

Hereinafter, the present fourth modification example with this devisal will be explained.

Figure 21:
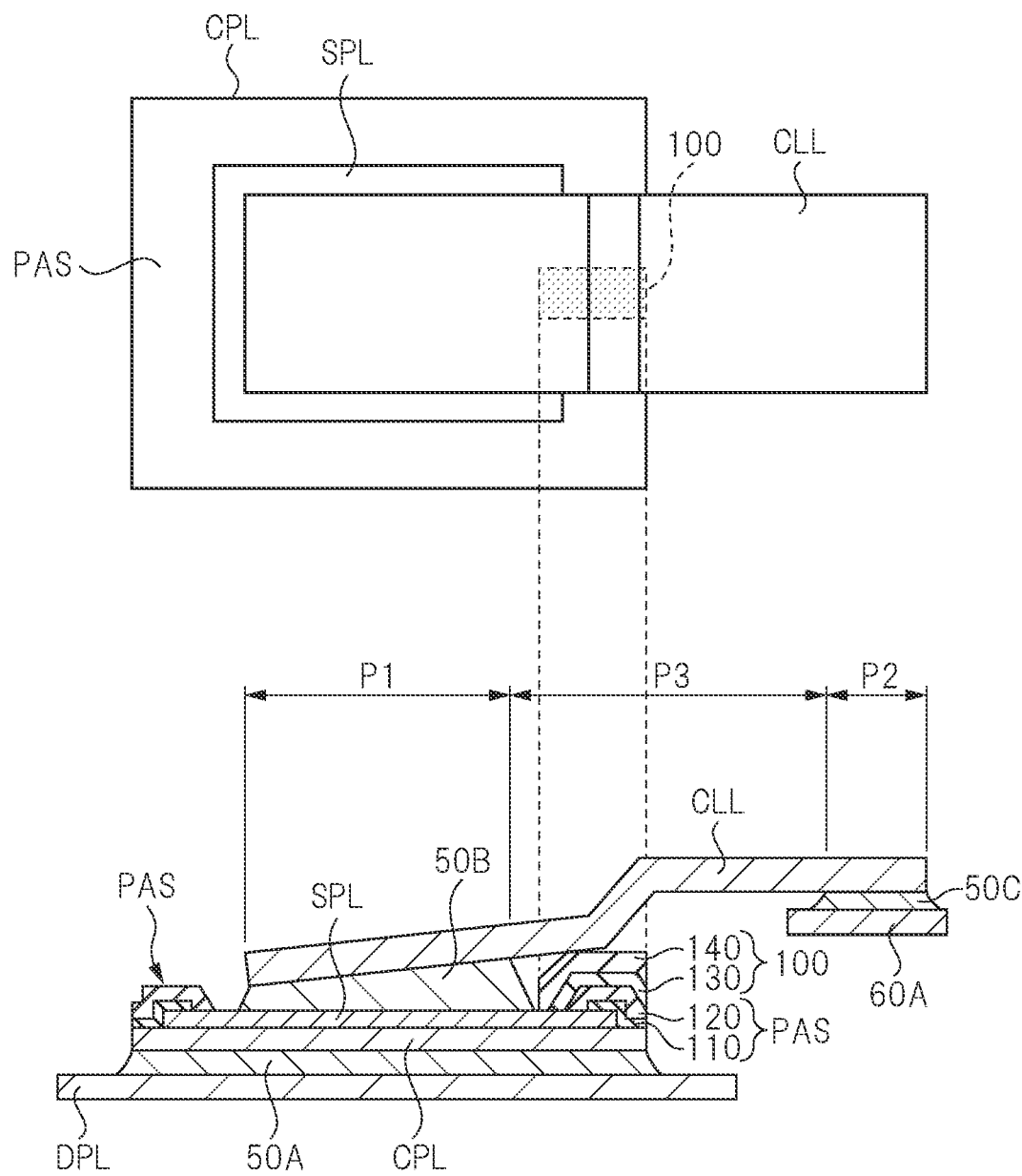
FIG. 21 is a schematic diagram illustrating a fourth modification example.

FIG. 21 is a schematic diagram illustrating the present fourth modification example.

In FIG. 21, this clip CLL has a "first part P1" in contact with a silver paste 50B, a "second part P2" in contact with a silver paste 50C, and a "third part P3" which is positioned between the "first part P1" and the "second part P2". The protruding member 100 in contact with the "third part P3" is formed on the protective film PAS formed at a root part of the clip CLL. In this manner, in present fourth modification example, the protruding member 100 is not disposed at the position in contact with the "first part P1" as illustrated in FIG. 7 but disposed at the position in contact with the "third part P3" as illustrated in FIG. 21. Herein, the protruding member 100 is formed on the protective film PAS, the protective film PAS is made of the stacked film of the silicon oxynitride film 110 and the first polyimide film 120, and the protruding member 100 is made of the stacked film of the second polyimide film 130 and a third polyimide film 140.

In this case, film thicknesses are as follows:
(1) Silicon oxynitride film 110: film thickness 0.9 μm
(2) First polyimide film 120: film thickness 8 μm
(3) Second polyimide film 130: film thickness 8 μm
(4) Third polyimide film 140: film thickness 8 μm Therefore, the total height of the protective film PAS and the protruding member 100 is 24.9 μm, and a sufficient height can be ensured. In this manner, the present fourth modification example can cause the clip CLL having the "positive tilt" to be supported by the protruding member 100 while configuring the "third part P3" and the protruding member 100 to be in contact with each other without the contact of the protruding member 100 to the "first part P1" in contact with the silver paste 50B. As a result, the "positive tilt" state of the clip CLL can be stably maintained. Particularly, in present fourth modification example, since the protruding member 100 is provided to avoid the formation region of the silver paste 50B, the obstruction of the current path of the silver paste 50B due to the protruding member 100 can be suppressed. As a result, the present fourth modification example can cause the clip CLL having the "positive tilt" to be supported by the protruding member 100 while suppressing the increase in the on resistance.

Fifth Modification Example

The above-described embodiment has been explained while exemplifying the configuration in which the surfaces of the die pads DPL (die pad DPC, die pad DPH) are exposed from the lower surface of the sealing body MR. However, the basic idea of the above-described embodiment is not limited thereto, but can be applied to, for example, a configuration in which the surfaces of the die pads DPL (die pad DPC, die pad DPH) are exposed from the upper surface of the sealing body MR.

In the case of the configuration of present fifth modification example, the resin sealing step (mold step) can be carried out with a configuration in which the exposed surface of the die pad DPL is in contact with the upper mold or with a configuration in which the exposed surface of the die pad DPL is in contact with the lower mold.

In the above-described embodiment, the die pad DPL is exposed from the lower surface of the sealing body, and the protruding member 100 is configured to protrude toward the upper surface of the sealing body. On the other hand, in the present fifth modification example, the die pad DPL is exposed from the upper surface of the sealing body, and the protruding member 100 is configured to protrude toward the lower surface of the sealing body.

In Claims, terms "first surface" and "second surface" are used so that the descriptions include the configuration of the above-described embodiment and the configuration of the present fifth modification example. In the case of the configuration of the above-described embodiment, the "first surface" corresponds to the lower surface, and the "second surface" corresponds to the upper surface. On the other hand, in the case of the configuration of the present fifth modification example, the "first surface" corresponds to the upper surface, and the "second surface" corresponds to the lower surface.

In the foregoing, the invention made by the present inventors has been concretely described on the basis of the embodiments. However, it is needless to say that the present invention is not limited to the foregoing embodiments, and various modifications can be made within the scope of the present invention.

The above-described embodiment has been explained on the assumption that the power MOSFET is used as the power transistor formed on the semiconductor chip. However, the technical idea of the above-described embodiment is not limited thereto, but can be widely applied to, for example, a semiconductor device which uses an insulated gate bipolar transistor (IGET) as the power transistor.

In such a case, the "main-transistor source pad" is replaced by a "main-transistor emitter pad". In Claims, the "first electrode" is used as a term which includes the "main-transistor source pad" and the "main-transistor emitter pad". In other words, the "first electrode" described in Claims is used with the intention of inclusion of the "main-transistor source pad" and the "main-transistor emitter pad".

The above-described embodiment has been explained while exemplifying the silver paste. However, the technical idea of the above-described embodiment is not limited thereto, but can be widely applied to, for example, a semiconductor device using solder. In Claims, the terms such as the "first conductive material" and the "second conductive material" are used as terms that include the "silver paste" and the "solder". In other words, the "first conductive material" and the "second conductive material" described in Claims are used with the intention of inclusion of the "silver paste" and the "solder".

What is claimed is:

1. A semiconductor device comprising:
   a die pad;
   a semiconductor chip including a first electrode and a protective film covering a peripheral portion of the first electrode, the semiconductor chip being mounted on the die pad;
   a lead disposed next to the semiconductor chip and separated from the die pad;
   a plate-like member mutually and electrically connecting the first electrode and the lead; and a sealing body having a first surface and a second surface opposite the first surface, the sealing body sealing the semiconductor chip and the plate-like member such that a part of the die pad is exposed from the first surface and such that a part of the lead is exposed, wherein the plate-like member is electrically connected to the first electrode via a first conductive material and is electrically connected to the lead via a second conductive material, wherein the plate-like member includes:
  a first part with which the first conductive material is in contact;
  a second part with which the second conductive material is in contact; and
  a third part positioned between the first part and the second part, wherein a protruding member protruding toward the second surface in comparison with the protective film is formed on a surface of the first electrode exposed from the protective film, wherein the first part is in contact with the protruding member, and wherein, in a cross-sectional view, the first part is tilted such that a distance between the first part and the second surface is to be shortened as the first part is closer to the third part.

2. The semiconductor device according to claim 1, wherein a planar shape of the first electrode is a polygon having:
  a first side intersecting with the third part in a plan view; and
  a second side on an opposite side of the first side, and wherein the protruding member is disposed at a position closer to the first side than the second side in a plan view.

3. The semiconductor device according to claim 2, wherein a surface of the first electrode has, in a first direction extending from either one of the first side and the second side toward the other,
  a first region positioned closer to the first side than a center line of the first electrode; and
  a second region positioned closer to the second side than the center line of the first electrode, and wherein the protruding member is provided in the first region and is separated from a boundary between the second region and the first region that is the center line.

4. The semiconductor device according to claim 1, wherein the protruding member is an insulating member.

5. The semiconductor device according to claim 4, wherein the protective film includes a first polyimide resin film, and wherein the protruding member includes:
  the first polyimide resin film; and
  a second polyimide resin film formed on the first polyimide resin film.

6. The semiconductor device according to claim 4, wherein the protruding member is made of a permanent resist.

7. The semiconductor device according to claim 1, wherein the number of the protruding members is plural.

8. The semiconductor device according to claim 1, wherein the plate-like member is a clip made of copper.

9. A semiconductor device comprising:
a die pad;
a semiconductor chip including a first electrode and a protective film covering a peripheral portion of the first electrode, the semiconductor chip being mounted on the die pad;
a lead disposed next to the semiconductor chip and separated from the die pad;
a plate-like member mutually and electrically connecting the first electrode and the lead; and
a sealing body having a first surface and a second surface opposite the first surface, the sealing body sealing the semiconductor chip and the plate-like member such that a part of the die pad is exposed from the first surface and such that a part of the lead is exposed, wherein the plate-like member is electrically connected to the first electrode via a first conductive material and is electrically connected to the lead via a second conductive material, wherein the plate-like member includes:
  a first part with which the first conductive material is in contact;
  a second part with which the second conductive material is in contact; and
  a third part positioned between the first part and the second part, wherein a protruding member with which the third part is in contact is formed on the protective film, and wherein, in a cross-sectional view, the first part is tilted such that a distance between the first part and the second surface is to be shortened as the first part is closer to the third part.

10. A method of manufacturing a semiconductor device comprising steps of:
  (a) preparing a lead frame including a die pad and a lead separated from the die pad;
  (b) preparing a semiconductor chip including a first electrode, a protective film covering a peripheral portion of the first electrode, and a protruding member formed on a surface of the first electrode exposed from the protective film;
  (c) mounting the semiconductor chip on the die pad;
  (d) forming a first conductive material on the first electrode and forming a second conductive material on the lead;
  (e) disposing a first part of a plate-like member on the first electrode via the first conductive material and disposing a second part of the plate-like member on the lead via the second conductive material, thereby mutually and electrically connecting the first electrode and the lead via the plate-like member; and
  (f) sealing the semiconductor chip and the plate-like member, wherein the plate-like member has:
  the first part with which the first conductive material is in contact;
  the second part with which the second conductive material is in contact; and
  a third part positioned between the first part and the second part, wherein, by causing the first part or the third part to be in contact with the protruding member in the step (e), the plate-like member is disposed in a state in which the first part is caused to have a positive tilt such that a height of a part between an end part of the plate-like member included in the first part and a surface of the first electrode is lower than a height of the protruding member in a cross-sectional view, wherein the step (f) includes the steps of:

(f1) sandwiching the lead frame after the step (e) with a first mold and a second mold facing the first mold such that a cavity space is formed therebetween; and (f2) forming a sealing body by flowing a resin into the cavity space, and wherein the step (f1) is carried out while a force that presses the die pad into the cavity space is applied by the first mold.

11. The method of manufacturing the semiconductor device according to claim 10, wherein, in the step (f1), entrance of the resin into a gap between the first mold and the die pad is suppressed.

12. The method of manufacturing the semiconductor device according to claim 10, wherein, by causing the first part to have the positive tilt in the step (e), negative tilt of the first part is suppressed even when the force that presses the die pad into the cavity space in the step (f) is applied.

13. The method of manufacturing the semiconductor device according to claim 10, wherein the semiconductor chip prepared in the step (b) is provided by following steps (b1) to (b4):

(b1) forming the first electrode on each of plural chip regions of a semiconductor wafer;

(b2) after the step (b1), forming a first insulating film configuring the protective film at the peripheral portion and in a first region of a surface region of the first electrode;

(b3) after the step (b2), forming a second insulating film on the first insulating film formed in the first region; and (b4) after the step (b3), providing plural semiconductor chips by dicing the plural chip regions.

14. The method of manufacturing the semiconductor device according to claim 10, wherein the semiconductor chip prepared in the step (b) is provided by following steps (b1) to (b4):

(b1) forming the first electrode in each of plural chip regions of a semiconductor wafer;

(b2) after the step (b1), forming a protective film at the peripheral portion of the first electrode;

(b3) after the step (b2), forming an insulating film having a film thickness larger than a film thickness of the protective film, on a first region of a surface region of the first electrode exposed from the protective film; and (b4) after the step (b3), providing plural semiconductor chips by dicing the plural chip regions.

* * * * *